(12) United States Patent
Wang et al.

(10) Patent No.: US 8,779,457 B2
(45) Date of Patent: *Jul. 15, 2014

| (54) | ELECTRODE STRUCTURE AND LIGHT-EMITTING DEVICE USING THE SAME |
|---|---|
| (75) | Inventors: Tai Chun Wang, Taichung (TW); Wei Chih Wen, Taichung (TW) |
| (73) | Assignee: Huga Optotech Inc., Taichung (TW) |
| (*) | Notice: Subject to any disclaimer, the term of this patent is extended or adjusted under 35 U.S.C. 154(b) by 185 days.<br>This patent is subject to a terminal disclaimer. |
| (21) | Appl. No.: 12/652,279 |
| (22) | Filed: Jan. 5, 2010 |
| (65) | Prior Publication Data<br>US 2010/0258824 A1 Oct. 14, 2010 |
| (30) | Foreign Application Priority Data<br>Apr. 9, 2009 (TW) .............................. 98111767 A |
| (51) | Int. Cl.<br>*H01L 33/00* (2010.01) |
| (52) | U.S. Cl.<br>USPC .. 257/99; 257/91; 257/E33.062; 257/E33.065 |
| (58) | Field of Classification Search<br>USPC .............. 257/91, E33.062, E33.065, E23.015<br>See application file for complete search history. |

(56) References Cited

U.S. PATENT DOCUMENTS

| 6,307,218 | B1 * | 10/2001 | Steigerwald et al. ........... 257/99 |
|---|---|---|---|
| 6,346,728 | B1 | 2/2002 | Inoue et al. |
| 6,984,851 | B2 | 1/2006 | Udagawa |
| 8,378,373 | B2 * | 2/2013 | Wang et al. .................... 257/99 |
| 2005/0156189 | A1 * | 7/2005 | Deguchi et al. ............... 257/103 |
| 2005/0224822 | A1 | 10/2005 | Liu |
| 2006/0192223 | A1 * | 8/2006 | Lee et al. ........................ 257/99 |
| 2008/0296603 | A1 * | 12/2008 | Chu ............................... 257/99 |
| 2010/0006885 | A1 * | 1/2010 | Gong ............................. 257/99 |

FOREIGN PATENT DOCUMENTS

TW 200849652 A 12/2008

* cited by examiner

*Primary Examiner* — Daniel Whalen
(74) *Attorney, Agent, or Firm* — Patterson & Sheridan, LLP

(57) ABSTRACT

An electrode structure includes at least two first electrodes and at least two second electrodes configured to be electrically connected in parallel to a power supply. Each of the first electrodes includes at least one first pad and at least one first extending wire with one end connected to the first pad, and the at least two first electrodes are spaced apart from each other. Each of the second electrodes includes at least one second pad and at least one second extending wire with one end connected to the second pad, and the at least two second electrodes are spaced apart from each other.

7 Claims, 15 Drawing Sheets

ELECTRODE STRUCTURE AND LIGHT-EMITTING DEVICE USING THE SAME

BACKGROUND OF THE INVENTION (A) Field of the Invention

The present invention relates to an electrode structure and light-emitting devices using the same, and more particularly, to an electrode structure with parallel-connected electrodes configured to prevent the light-emitting device from overheating by eliminating the current-crowding phenomenon so as to dramatically improve the reliability of the light-emitting device.

(B) Description of the Related Art

Semiconductor light-emitting devices such as light-emitting diodes (LED) are widely used in traffic lights, vehicle electronics, LCD backing lights, and general illumination. In the light-emitting diode an n-type semiconductor layer, a light-emitting region and a p-type semiconductor layer are essentially made to grow on a substrate to form a layered structure, and the electrodes are formed on the p-type semiconductor layer and on the n-type semiconductor layer. Light is generated through the recombination of holes and electrons that have been injected through the semiconductor layers to the light-emitting region, and then emitted through a light transmitting electrode on the p-type semiconductor layer or from the substrate. The material used for preparing the visible light-emitting diode includes the III-V compound such as AlGaInP for green, yellow, orange or red light-emitting diodes, and GaN for blue or ultraviolet light-emitting diodes, wherein the GaN light-emitting diode is formed on the sapphire substrate.

FIG. 1 illustrates a top view of a nitride light-emitting device 30 according to the prior art, and FIG. 2 illustrates a cross-sectional view of the nitride light-emitting device 30 according to the prior art. The nitride light-emitting device 30 according to the prior art includes a sapphire substrate 32, an n-type nitride semiconductor layer 34, a light-emitting layer 36, a p-type nitride semiconductor layer 38, a contact layer 40, a p-type electrode 42, and an n-type electrode 44. The n-type electrode 44 is formed on the top surface of the n-type nitride semiconductor layer 34, and the p-type electrode 42 is formed on the top surface of the contact layer 44.

The nitride light-emitting device 30 suffers from a current-crowing problem, i.e., the current is not distributed uniformly between the n-type electrode 44 and the p-type electrode 42, and concentrates at a local region 46 of the light-emitting layer 36 in close proximity to the n-type electrode 44. This current-crowding problem not only increases the forward biasing voltage of the light-emitting diode, but also reduces the light-emitting efficiency of the light-emitting layer 36 at the side distant from the n-type electrode 44, which decreases the overall brightness of the light-emitting device 30. In addition, progressively accumulating heat in the local region 46 causes the overheating phenomenon, which dramatically decreases the reliability of the light-emitting diode.

FIG. 3 and FIG. 4 illustrate a light-emitting diode array disclosed in US 2005/0224822. The preparation of the light-emitting diode array includes forming a depression by etching, filling dielectric material 17 into the depression to divide the light-emitting stack consisting of a first type semiconductor 14, a light-emitting layer 15 and a second type semiconductor layer 16 into a plurality of light-emitting diodes 1a and 1b, and connecting the first electrode 18 and the second electrode 19 of the adjacent light-emitting diodes 1a and 1b in series to form the series-connected light-emitting diode array, as shown in FIG. 4.

SUMMARY OF THE INVENTION

One aspect of the present invention provides an electrode structure with parallel-connected electrodes configured to prevent the light-emitting device from overheating by eliminating the current-crowding phenomenon so as to dramatically improve the reliability of the light-emitting device.

An electrode structure according to this aspect of the present invention includes at least two first electrodes and at least two second electrodes configured to be electrically connected in parallel to a power supply. Each of the first electrodes includes at least one first pad and at least one first extending wire with one end connected to the first pad, and the at least two first electrodes are spaced apart from each other. Each of the second electrodes includes at least one second pad and at least one second extending wire with one end connected to the second pad, and the at least two second electrodes being spaced apart from each other.

Another aspect of the present invention provides a light-emitting device including a substrate; a stacked structure including a first type semiconductor layer positioned on the substrate, a light-emitting structure positioned on the first type semiconductor layer, and a second type semiconductor layer positioned on the light-emitting structure, wherein the stacked structure includes a depression exposing the first type semiconductor layer; at least two first electrodes positioned on the first type semiconductor layer in the depression, each of the first electrodes including at least one first pad and at least one first extending wire with one end connected to the first pad, the at least two first electrodes being spaced apart from each other; and at least two second electrodes positioned on the second type semiconductor layer, each of the second electrodes including at least one second pad and at least one second extending wire with one end connected to the second pad, the at least two second electrodes being spaced apart from each other.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 5:
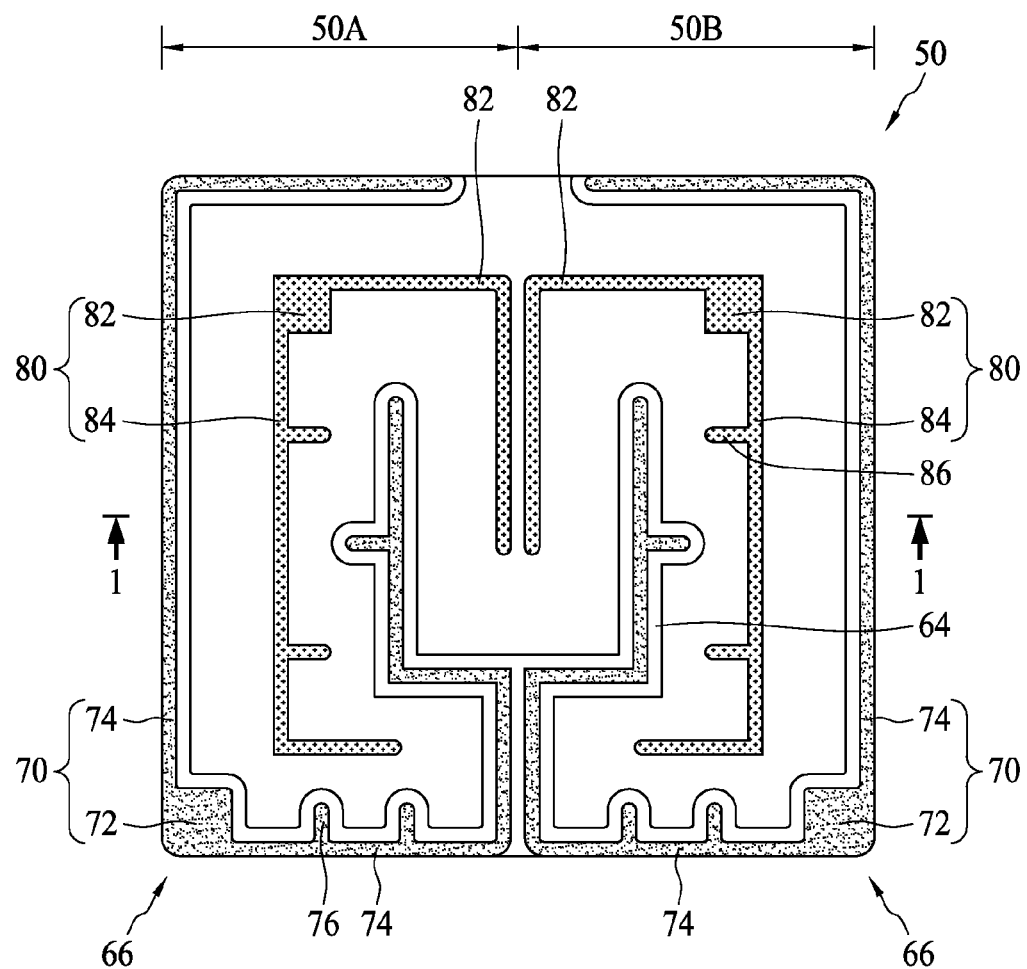
FIG. 5 is a top view of the light-emitting device according to one embodiment of the present disclosure.
Figure 6:
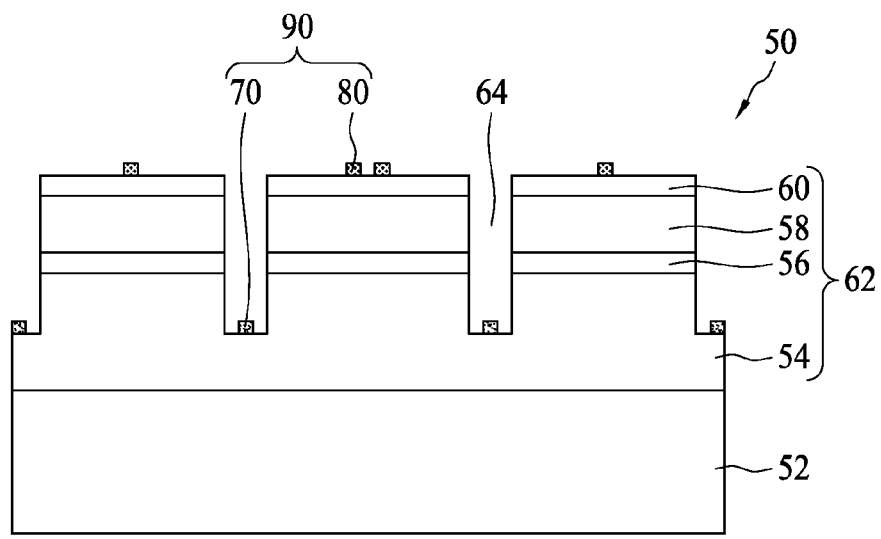
FIG. 6 is a cross-sectional view along the line 1-1 in FIG. 5.
Figure 7:
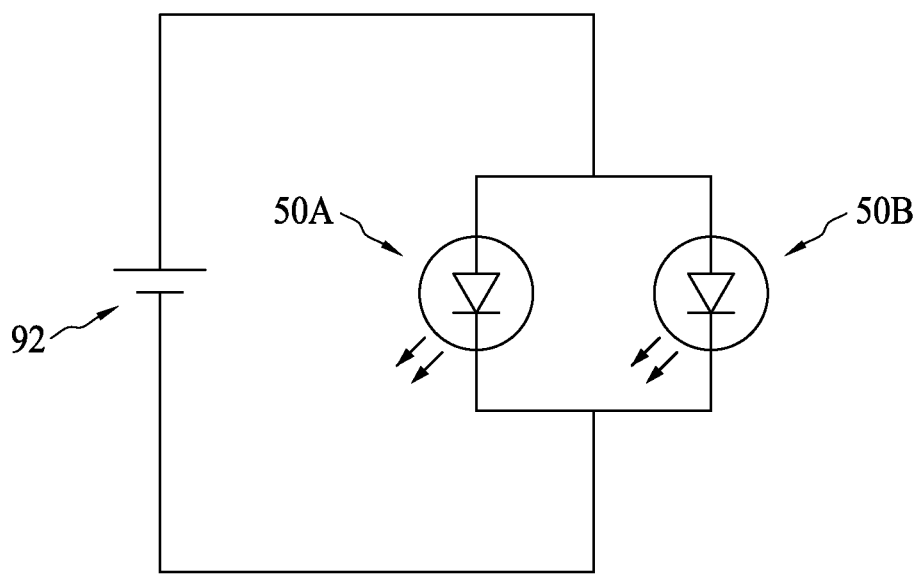
FIG. 7 is an equivalent circuit of the light-emitting device in FIG. 5 electrically connected to a power supply.

FIGS. 5 to 7 illustrate a light-emitting device 50 according to one embodiment of the present disclosure, wherein FIG. 5 is a top view of the light-emitting device 50, FIG. 6 is a cross-sectional view along the line 1-1 in FIG. 5, and FIG. 7 is an equivalent circuit of the light-emitting device 50 electrically connected to a power supply 92. Referring to FIG. 5 and FIG. 6, the light-emitting device 50 includes a substrate 52, a stacked structure 62 with a depression 64 therein, at least two first electrodes 70 positioned in the depression 64, and at least two second electrodes 80 positioned on the stacked structure 62. The stacked structure 62 includes a first type (n-type) semiconductor layer 54 positioned on the substrate 52, a light-emitting structure 56 positioned on the first type semiconductor layer 54, a second type (p-type) semiconductor layer 58 positioned on the light-emitting structure 56, and a contact layer 60 positioned on the second type semiconductor layer 58.

The at least two first electrodes 70 serve as the n-type electrode of the light-emitting device 50 and the at least two second electrodes 80 serve as the p-type electrode of the light-emitting device 50 to form an electrode structure 90. The depression 64 exposes the first type semiconductor layer 54, and the at least two first electrodes 70 are positioned on the first type semiconductor layer 54 in the depression 64. The at least two first electrodes 70 are spaced apart from each other, and each of the first electrodes 70 includes at least one first pad 72 and at least one first extending wire 74 with one end connected to the first pad 72. The at least two second electrodes 80 are spaced apart from each other and positioned on the second type semiconductor layer 58 such as on the surface of the contact layer 60. Each of the second electrodes 80 includes at least one second pad 82 and at least one second extending wire 84 with one end connected to the second pad 82. The light-emitting device 50 is rectangular, and the first pad 72 is positioned at a corner 66.

Referring to FIG. 5, the first electrode 70 includes a plurality of first branches 76 with one end connected to the first extending wire 74, and the second electrode 80 includes a plurality of second branches 86 with one end connected to the second extending wire 84. The second electrode 80 is positioned in the first electrode 70. The second extending wire 84 is straight and positioned in the interior of the light-emitting device 50, and the first extending wire 74 is straight and positioned at the border of the light-emitting device 50. In one embodiment of the present disclosure, the distance between the second pad 82 and the border of the electrode structure 90 (or the border of the light-emitting device 50) is less than 200 microns.

Referring to FIG. 5 and FIG. 7, the light-emitting device 50 can be considered as two light-emitting diodes 50A and 50B that use the same stacked structure 62 but use the respective p-type electrode 80 and n-type electrode 70. In case of connecting the first pad 72 of the first type electrode (n-type electrode) 70 to the negative electrode of the power supply 92 and connecting the second pad 82 of the second electrode (p-type electrode) 80 to the positive electrode of the power supply 92, the light-emitting device 50 can be considered as the two light-emitting diodes 50A and 50B connecting to the power supply 92 in parallel. At least one end of the depression 64 is inside the interior of the stacked structure 92, and the depression 64 in the light-emitting device 50A and the depression in the light-emitting device 50B are arranged in a mirror-image manner. In addition, the first electrode 70 and the second electrode 80 in the light-emitting device 50A and those in the light-emitting device 50B are arranged in a mirror-image manner.

Figure 1:
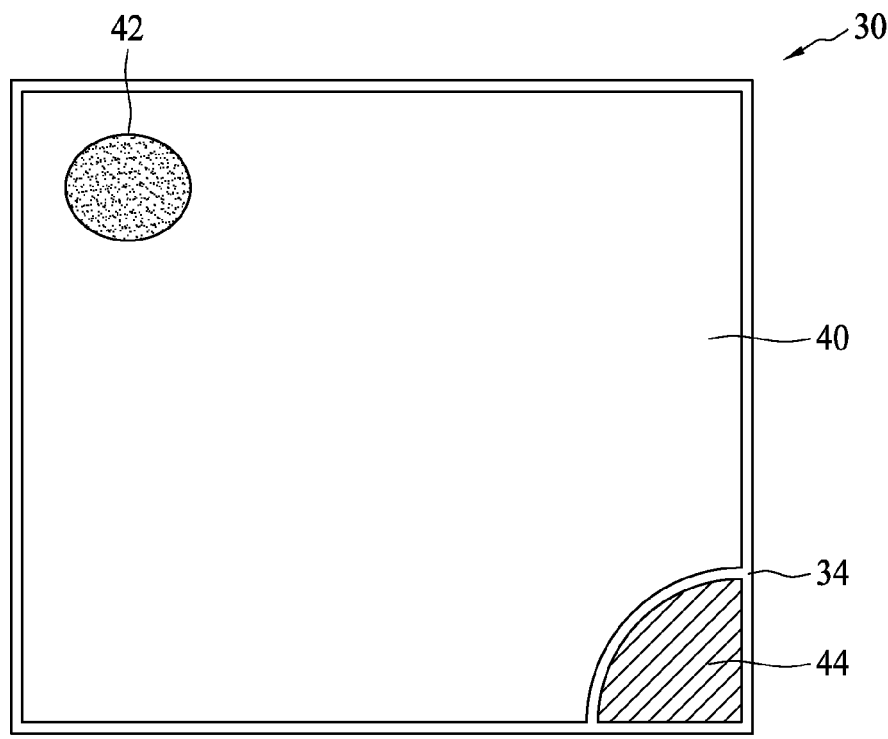
FIG. 1 illustrates a top view of a nitride light-emitting device according to the prior art.
Figure 2:
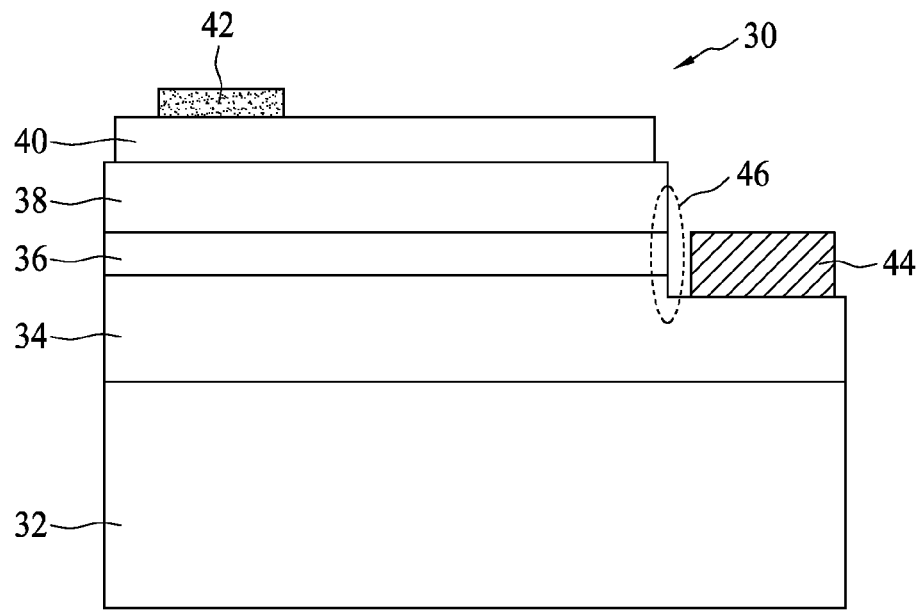
FIG. 2 illustrates a cross-sectional view of the nitride light-emitting device according to the prior art.

The design of the p-type electrode 42 and the n-type electrode 44 in the nitride light-emitting device 30 shown in FIG. 1 and FIG. 2 only provides a single current path, and the current is not distributed uniformly, thus generating the current-crowding problem. The current-crowding problem not only increases the forward biasing voltage of the light-emitting diode, but also decreases the light-emitting efficiency of the light-emitting layer 36 at the side distant from the n-type electrode 44, which decreases the overall brightness of the light-emitting device 30. Furthermore, heat accumulating progressively in the local region 46 causes the overheating phenomenon, which dramatically decreases the reliability of the light-emitting diode. In contrast, the electrode structure 90 of the present disclosure uses the multiple electrode design to provide multiple current paths so as to solve the current-crowding problem of the prior art and reduce the forward biasing voltage, and the overheating problem is eliminated.

Figure 3:
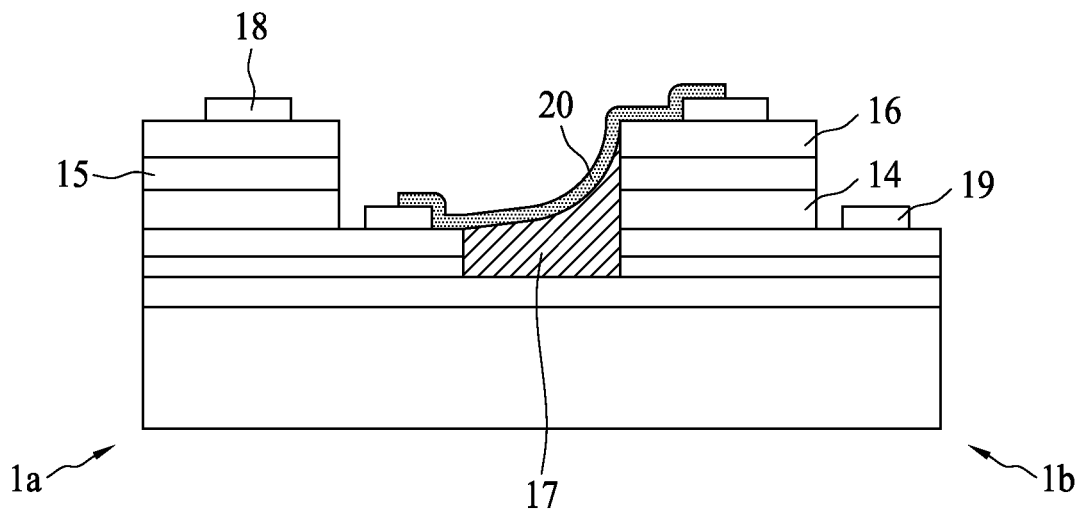
FIG. 3 and FIG. 4 illustrate a light-emitting diode array disclosed in US 2005/0224822.
Figure 4:
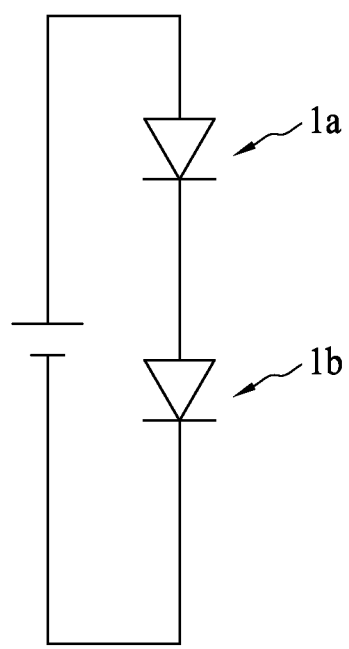

The light-emitting diode array shown in FIG. 3 and FIG. 4 electrically connects the adjacent light-emitting diodes 1a and 1b in series by wires 20 to form the series-connected light-emitting diode array. The overall resistance of the series-connected light-emitting diode array is higher than that of the individual light-emitting diode, and the series-connected light-emitting diode array needs a greater power supply. In contrast, the electrode structure 90 of the present disclosure uses the multiple electrode design such that the light-emitting device 50 can be considered as two light-emitting diodes 50A and 50B connected to the power supply 92 in parallel, the overall resistance of the parallel-connected light-emitting diodes is lower than that of the individual light-emitting diode, and thus the light-emitting device requires a lesser power supply.

Figure 8:
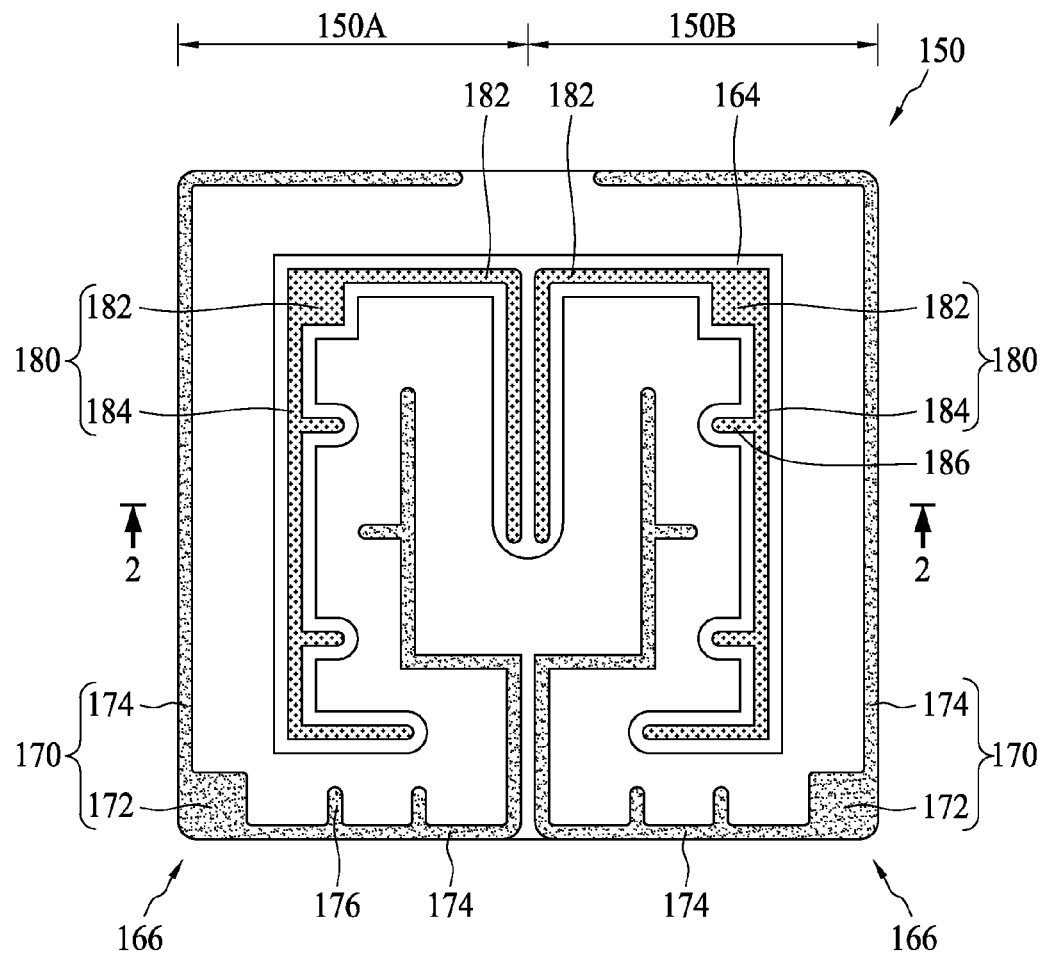
FIG. 8 is a top view of the light-emitting device according to one embodiment of the present disclosure.
Figure 9:
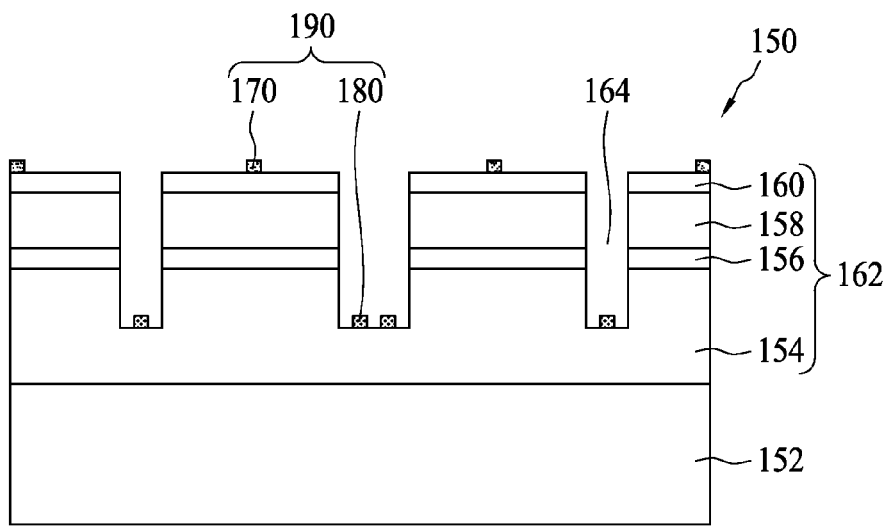
FIG. 9 is a cross-sectional view along the line 2-2 in FIG. 8.
Figure 10:
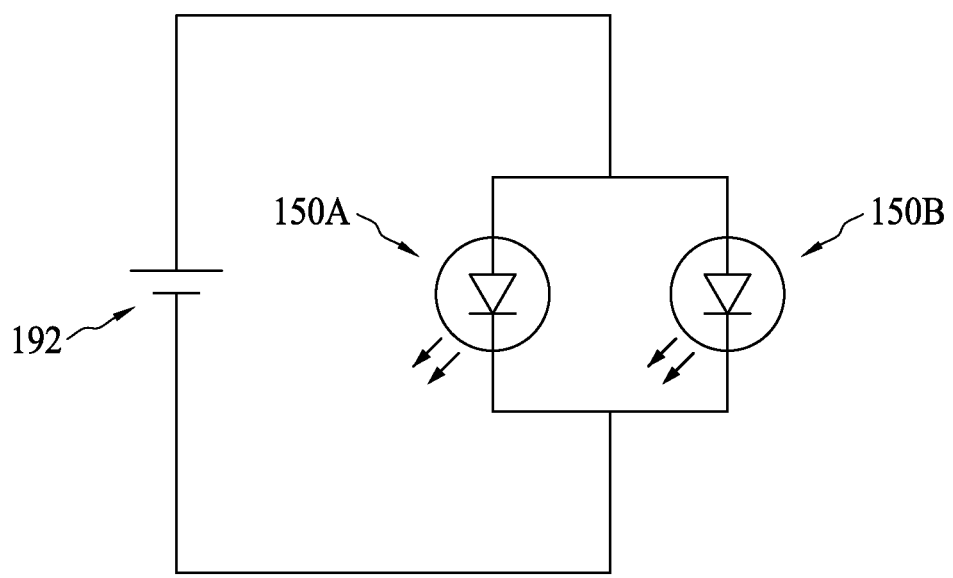
FIG. 10 is an equivalent circuit of the light-emitting device in FIG. 8 electrically connected to a power supply.

FIGS. 8 to 10 illustrate a light-emitting device 150 according to another embodiment of the present disclosure, wherein FIG. 8 is a top view of the light-emitting device 150, FIG. 9 is a cross-sectional view along the line 2-2 in FIG. 8, and FIG. 10 is an equivalent circuit of the light-emitting device 150 electrically connected to a power supply 192. Referring to FIG. 9 and FIG. 10, the light-emitting device 150 includes a substrate 152, a stacked structure 162 with a depression 164 therein, at least two second electrodes 180 positioned in the depression 164, and at least two first electrodes 170 positioned on the stacked structure 162. The stacked structure 162 includes a first type (n-type) semiconductor layer 154 positioned on the substrate 152, a light-emitting structure 156 positioned on the first type semiconductor layer 154, a second type (p-type) semiconductor layer 158 positioned on the light-emitting structure 156, and a contact layer 160 positioned on the second type semiconductor layer 158.

The at least two first electrodes 170 serve as the p-type electrode of the light-emitting device 150 and the at least two second electrodes 180 serve as the n-type electrode of the light-emitting device 150 to form an electrode structure 190. The at least two first electrodes 170 are positioned on the second type semiconductor layer 158 such as on the surface of the contact layer 160, and the at least two first electrodes 170 are spaced apart from each other. Each of the first electrodes 170 includes at least one first pad 172 and at least one first extending wire 174 with one end connected to the first pad 172. The light-emitting device 150 is rectangular, and the first pad 172 is positioned at a corner 166. The depression 164 exposes the first type semiconductor layer 154, and the at least two second electrodes 180 are positioned on the first type semiconductor layer 154 in the depression 164. The at least two second electrodes 180 are spaced apart from each other, and each of the second electrodes 180 includes at least one second pad 182 and at least one second extending wire 184 with one end connected to the second pad 182.

Referring to FIG. 8, the first electrode 170 includes a plurality of first branches 176 with one end connected to the first extending wire 174, and the second electrode 180 includes a plurality of second branches 186 with one end connected to the second extending wire 184. The second electrode 180 is positioned in the first electrode 170. The second extending wire 184 is straight and positioned in the interior of the light-emitting device 150, and the first extending wire 174 is straight and positioned at the border of the light-emitting device 150. In one embodiment of the present disclosure, the distance between the second pad 182 and the border of the electrode structure 190 (or the border of the light-emitting device 150) is less than 200 microns.

Referring to FIG. 8 and FIG. 10, the light-emitting device 150 can be considered as two light-emitting diodes 150A and 150B that use the same stacked structure 162 but use the respective n-type electrode 180 and p-type electrode 170. In case of connecting the first pad 172 of the first type electrode 170 (p-type electrode) to the positive electrode of the power supply 192 and connecting the second pad 182 of the second electrode (n-type electrode) 180 to the negative electrode of the power supply 192, the light-emitting device 150 can be considered as the two light-emitting diodes 150A and 150B connecting to the power supply 192 in parallel. At least one end of the depression 164 is inside the interior of the stacked structure 192, and the depression 164 in the light-emitting device 150A and that in the light-emitting device 150B are arranged in a mirror-image manner. In addition, the first electrode 170 and the second electrode 180 in the light-emitting device 150A and those in the light-emitting device 150B are arranged in a mirror-image manner.

Figure 11:
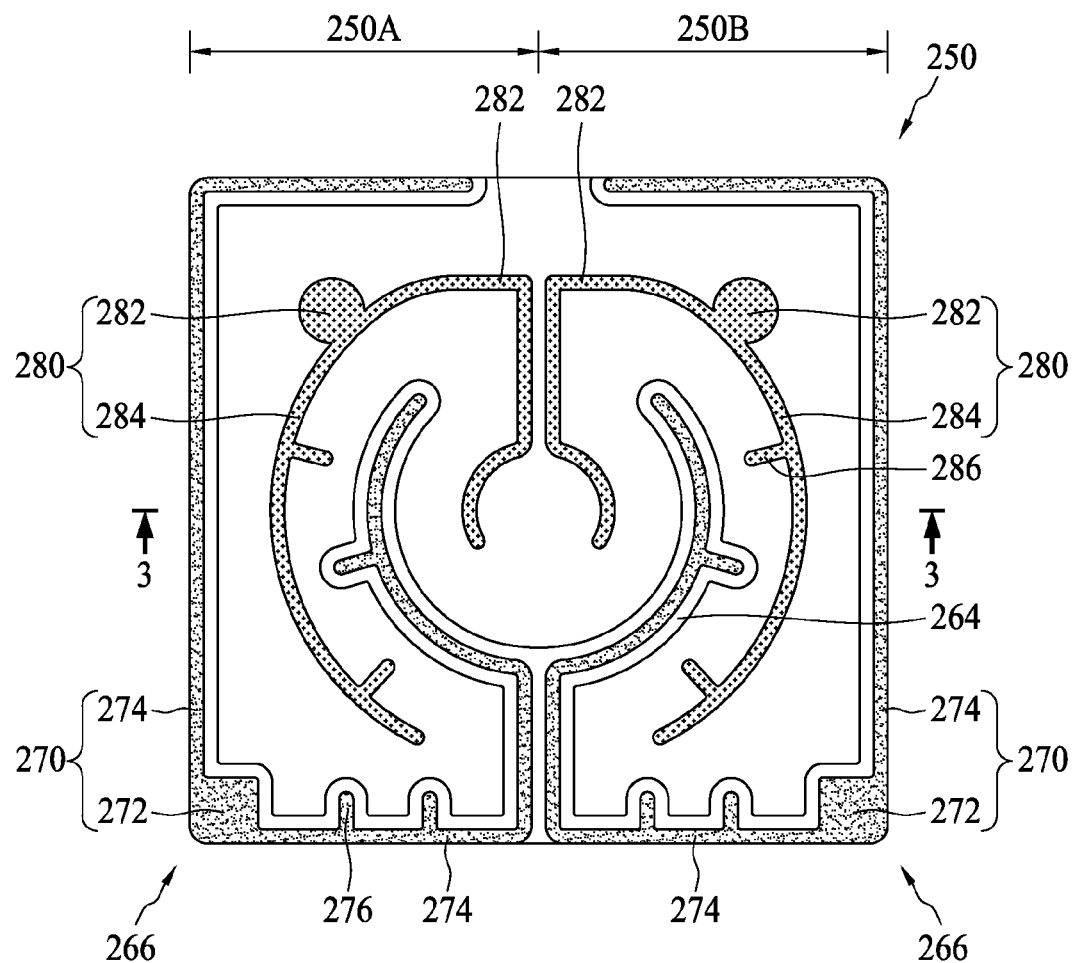
FIG. 11 is a top view of the light-emitting device according to one embodiment of the present disclosure.
Figure 12:
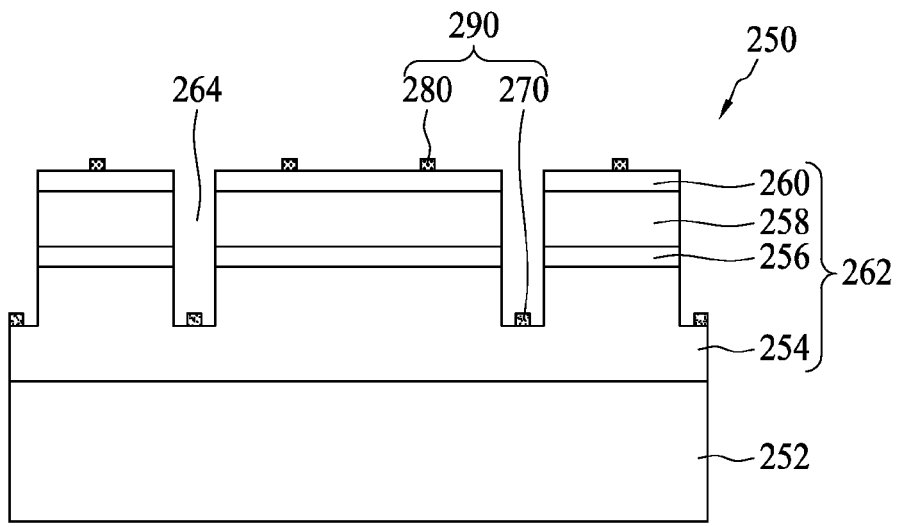
FIG. 12 is a cross-sectional view along the line 3-3 in FIG. 11.
Figure 13:
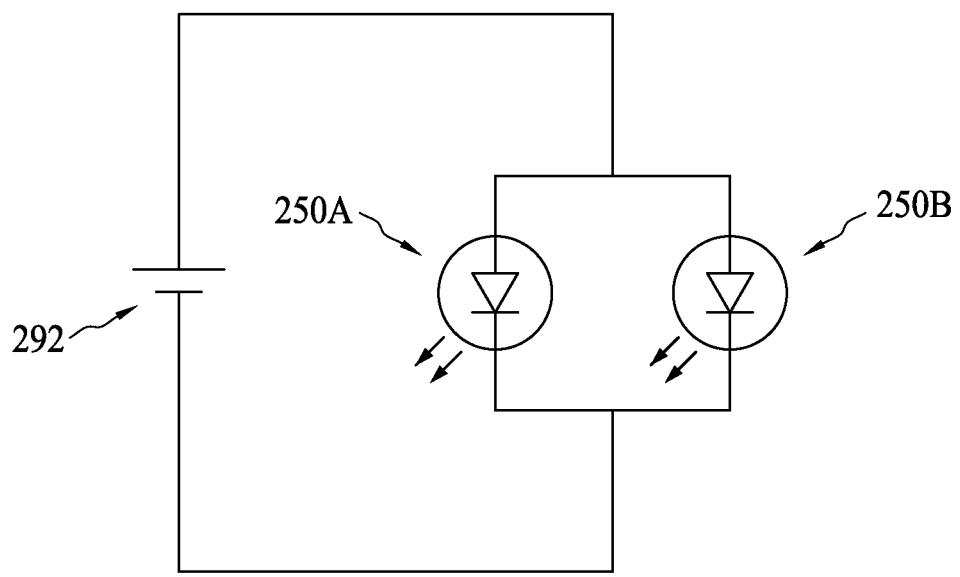
FIG. 13 is an equivalent circuit of the light-emitting device in FIG. 11 electrically connected to a power supply.

FIGS. 11 to 13 illustrate a light-emitting device 250 according to another embodiment of the present disclosure, wherein FIG. 11 is a top view of the light-emitting device 250, FIG. 12 is a cross-sectional view along the line 3-3 in FIG. 11, and FIG. 13 is an equivalent circuit of the light-emitting device 250 electrically connected to a power supply 292. The light-emitting device 250 includes a substrate 252, a stacked structure 262 with a depression 264 therein, at least two first electrodes 270 positioned in the depression 264, and at least two second electrodes 280 positioned on the stacked structure 262. The stacked structure 262 includes a first type (n-type) semiconductor layer 254 positioned on the substrate 252, a light-emitting structure 256 positioned on the first type semiconductor layer 254, a second type (p-type) semiconductor layer 258 positioned on the light-emitting structure 256, and a contact layer 260 positioned on the second type semiconductor layer 258.

The at least two first electrodes 270 serve as the n-type electrode of the light-emitting device 250 and the at least two second electrodes 280 serve as the p-type electrode of the light-emitting device 250 to form an electrode structure 290. The depression 264 exposes the first type semiconductor layer 254, and the at least two first electrodes 270 are positioned on the first type semiconductor layer 254 in the depression 264. The at least two first electrodes 270 are spaced apart from each other, and each of the first electrodes 270 includes at least one first pad 272 and at least one first extending wire 274 with one end connected to the first pad 272. The at least two second electrodes 280 are spaced apart from each other and positioned on the second type semiconductor layer 258 such as on the surface of the contact layer 260. Each of the second electrodes 280 includes at least one second pad 282 and at least one second extending wire 284 with one end connected to the second pad 282. The light-emitting device 250 is rectangular, and the first pad 272 is positioned at a corner 266.

Referring to FIG. 11, the first electrode 270 includes a plurality of first branches 276 with one end connected to the first extending wire 274, and the second electrode 280 includes a plurality of second branches 286 with one end connected to the second extending wire 284. The second electrode 280 is positioned in the first electrode 270. The second extending wire 284 can be straight or arched, and positioned in the interior of the light-emitting device 250. In addition, the first extending wire 274 is straight and positioned at the border of the light-emitting device 150, or arched and positioned in the interior of the light-emitting device 250. In one embodiment of the present disclosure, the distance between the second pad 282 and the border of the electrode structure 290 (or the border of the light-emitting device 250) is less than 200 microns.

Referring to FIGS. 11 and 13, the light-emitting device 250 can be considered as two light-emitting diodes 250A and 250B that use the same stacked structure 262 but use the respective p-type electrode 280 and n-type electrode 270. In case of connecting the first pad 272 of the first type electrode (n-type electrode) 270 to the negative electrode of the power supply 292 and connecting the second pad 282 of the second electrode (p-type electrode) 280 to the positive electrode of the power supply 292, the light-emitting device 250 can be considered as the two light-emitting diodes 250A and 250B connecting to the power supply 292 in parallel. At least one end of the depression 264 is inside the interior of the stacked structure 292, and the depression 264 in the light-emitting device 250A and that in the light-emitting device 250B are arranged in a mirror-image manner. In addition, the first electrode 270 and the second electrode 280 in the light-emitting device 250A and those in the light-emitting device 250B are arranged in a mirror-image manner.

Figure 14:
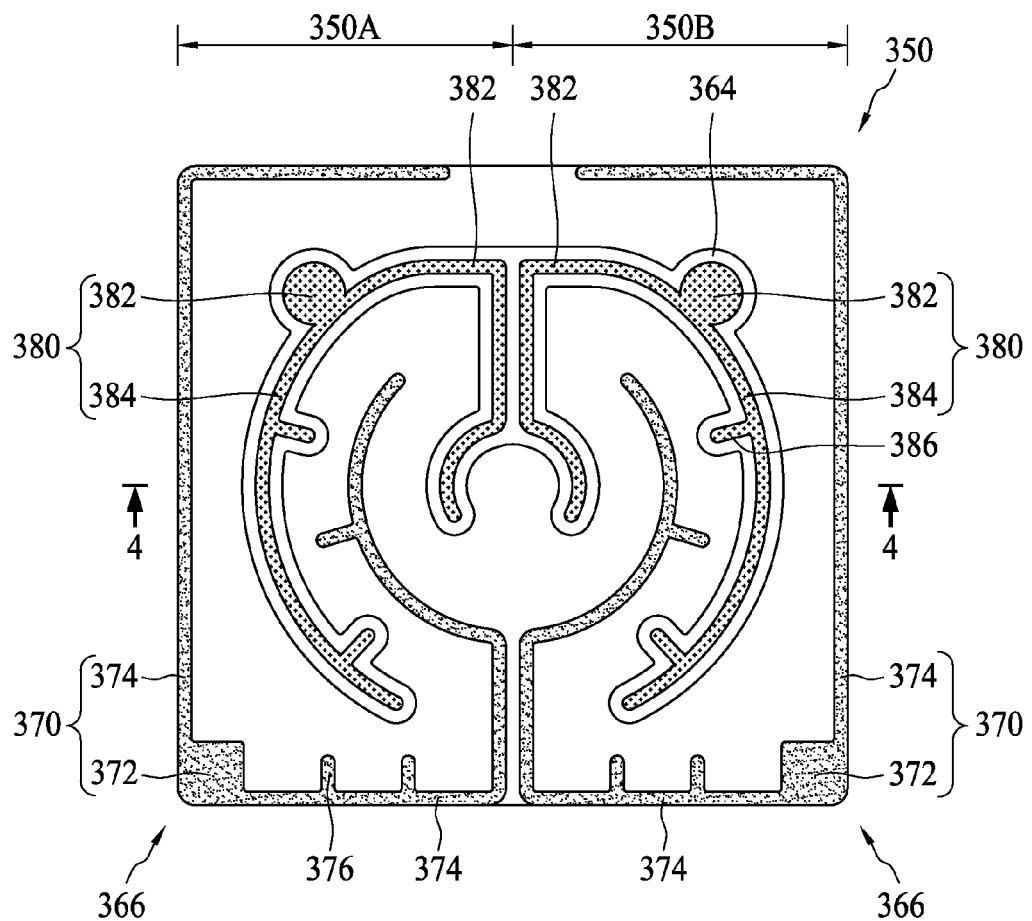
FIG. 14 is a top view of the light-emitting device according to one embodiment of the present disclosure.
Figure 15:
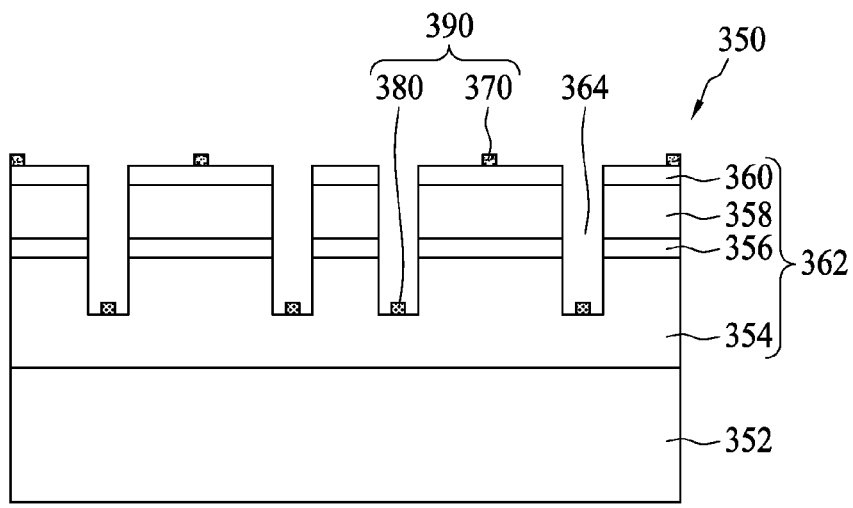
FIG. 15 is a cross-sectional view along the line 4-4 in FIG. 14.
Figure 16:
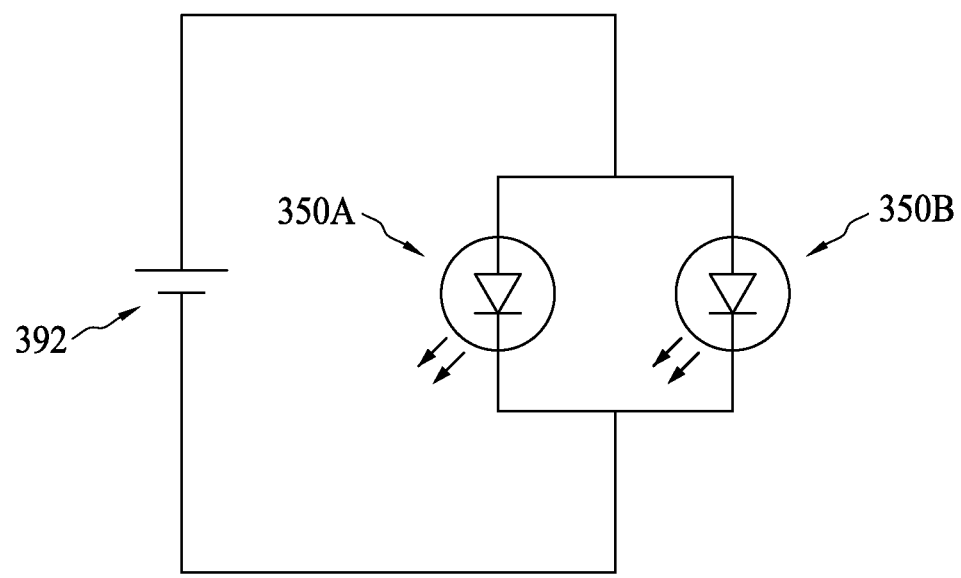
FIG. 16 is an equivalent circuit of the light-emitting device in FIG. 14 electrically connected to a power supply.

FIGS. 14 to 16 illustrate a light-emitting device 350 according to one embodiment of the present disclosure, wherein FIG. 14 is a top view of the light-emitting device 350, FIG. 15 is a cross-sectional view along the line 4-4 in FIG. 14, and FIG. 16 is an equivalent circuit of the light-emitting device 350 electrically connected to a power supply 392. Referring to FIG. 14 and FIG. 15, the light-emitting device 350 includes a substrate 352, a stacked structure 362 with a depression 364 therein, at least two second electrodes 380 positioned in the depression 364, and at least two first electrodes 370 positioned on the stacked structure 362. The stacked structure 362 includes a first type (n-type) semiconductor layer 354 positioned on the substrate 352, a light-emitting structure 356 positioned on the first type semiconductor layer 354, a second type (p-type) semiconductor layer 358 positioned on the light-emitting structure 356, and a contact layer 360 positioned on the second type semiconductor layer 358.

The at least two second electrodes 380 serve as the n-type electrode of the light-emitting device 350 and the at least two first electrodes 370 serve as the p-type electrode of the light-emitting device 350 to form an electrode structure 390. The at least two first electrodes 370 are spaced apart from each other and positioned on the second type semiconductor layer 358 such as on the surface of the contact layer 360. Each of the first electrodes 370 includes at least one first pad 372 and at least one first extending wire 374 with one end connected to the first pad 372. The light-emitting device 350 is rectangular, and the first pad 372 is positioned at a corner 366. The depression 364 exposes the first type semiconductor layer 354, and the at least two second electrodes 380 are positioned on the first type semiconductor layer 354 in the depression 364. The at least two second electrodes 380 are spaced apart from each other, and each of the second electrodes 380 includes at least one second pad 382 and at least one second extending wire 384 with one end connected to the second pad 382.

Referring to FIG. 14, the first electrode 370 includes a plurality of first branches 376 with one end connected to the first extending wire 374, and the second electrode 380 includes a plurality of second branches 386 with one end connected to the second extending wire 384. The second electrode 380 is positioned in the first electrode 370. The second extending wire 384 is straight or arched, and positioned in the interior of the light-emitting device 350, and the first extending wire 374 is straight or arched, and positioned at the border of the light-emitting device 350. In one embodiment of the present disclosure, the distance between the second pad 382 and the border of the electrode structure 390 (or the border of the light-emitting device 350) is less than 200 microns.

Referring to FIGS. 14 and 16, the light-emitting device 350 can be considered as two light-emitting diodes 350A and 350B that use the same stacked structure 362 but use the respective n-type electrode 380 and p-type electrode 370. In case of connecting the first pad 372 of the first type electrode (p-type electrode) 370 to the positive electrode of the power supply 392 and connecting the second pad 382 of the second electrode (n-type electrode) 380 to the negative electrode of the power supply 392, the light-emitting device 350 can be considered as the two light-emitting diodes 350A and 350B connecting to the power supply 392 in parallel. At least one end of the depression 364 is inside the interior of the stacked structure 392, and the depression 364 in the light-emitting device 350A and that in the light-emitting device 350B are arranged in a mirror-image manner. In addition, the first electrode 370 and the second electrode 380 in the light-emitting device 350A and those in the light-emitting device 350B are arranged in a mirror-image manner.

Figure 17:
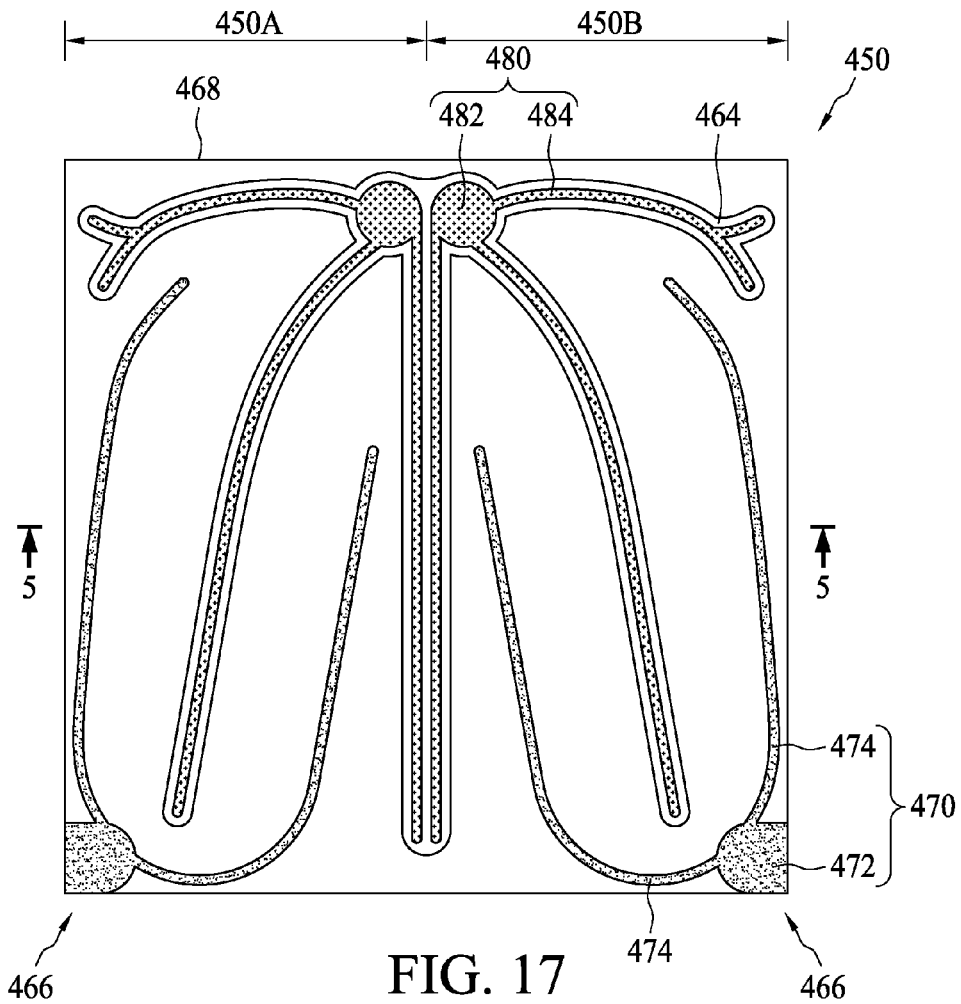
FIG. 17 is a top view of the light-emitting device according to one embodiment of the present disclosure.
Figure 18:
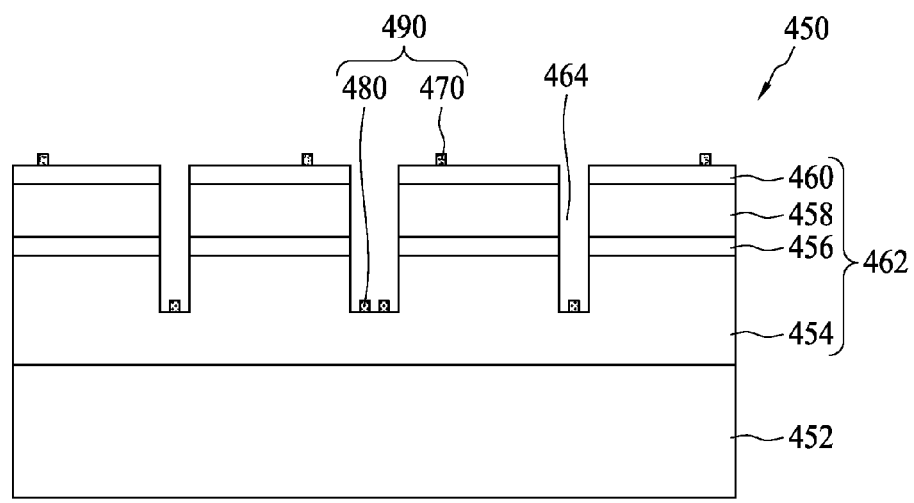
FIG. 18 is a cross-sectional view along the line 5-5 in FIG. 17.
Figure 19:
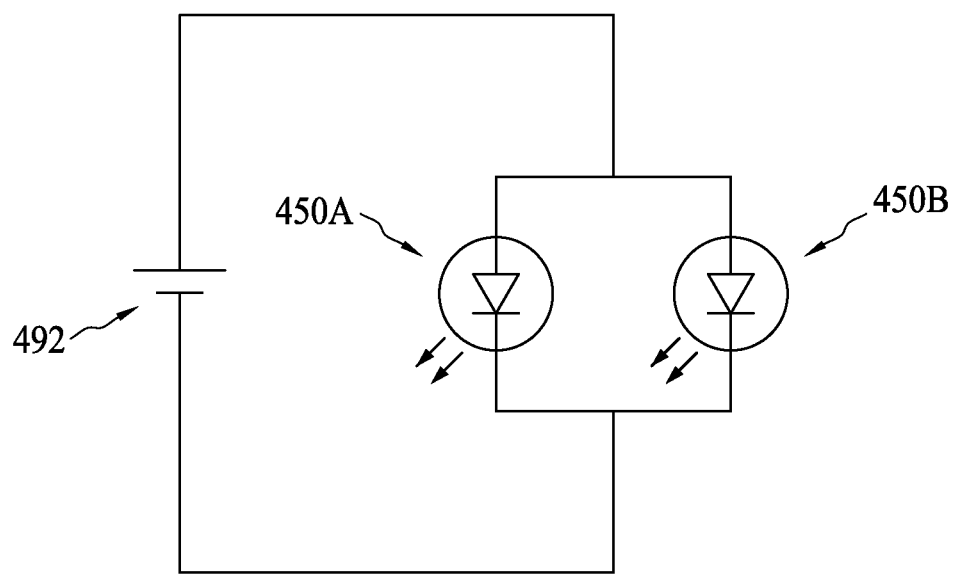
FIG. 19 is an equivalent circuit of the light-emitting device in FIG. 17 electrically connected to a power supply.

FIGS. 17 to 19 illustrate a light-emitting device 450 according to one embodiment of the present disclosure, wherein FIG. 17 is a top view of the light-emitting device 450, FIG. 18 is a cross-sectional view along the line 5-5 in FIG. 17, and FIG. 19 is an equivalent circuit of the light-emitting device 450 electrically connected to a power supply 492. Referring to FIG. 17 and FIG. 18, the light-emitting device 450 includes a substrate 452, a stacked structure 462 with a depression 464 therein, at least two second electrodes 480 positioned in the depression 464, and at least two first electrodes 470 positioned on the stacked structure 462. The stacked structure 462 includes a first type (n-type) semiconductor layer 454 positioned on the substrate 452, a light-emitting structure 456 positioned on the first type semiconductor layer 454, a second type (p-type) semiconductor layer 458 positioned on the light-emitting structure 456, and a contact layer 460 positioned on the second type semiconductor layer 458.

The at least two second electrodes 480 serve as the n-type electrode of the light-emitting device 450 and the at least two first electrodes 470 serve as the p-type electrode of the light-emitting device 450 to form an electrode structure 490. The at least two first electrodes 470 are spaced apart from each other and positioned on the second type semiconductor layer 458 such as on the surface of the contact layer 460. The first electrodes 470 can be an interdigital electrode including at least one first pad 472 and at least one first extending wire 474 with one end connected to the first pad 472. For example, the first electrode 470 can be an interdigital electrode including two first extending wires 474. The depression 464 exposes the first type semiconductor layer 454, and the at least two first electrodes 470 are positioned on the first type semiconductor layer 454 in the depression 464. The at least two second electrodes 480 are spaced apart from each other, and each of the second electrode 480 includes at least one second pad 482 and at least one second extending wire 484 with one end connected to the second pad 482. For example, the second electrode 480 can be an interdigital electrode including three second extending wires 484. In one embodiment of the present disclosure, the distance between the second pad 482 and the border of the electrode structure 490 (or the border of the light-emitting device 450) is less than 200 microns.

Referring to FIG. 17 and FIG. 19, the light-emitting device 450 can be considered as two light-emitting diodes 450A and 450B that use the same stacked structure 462 but use the respective p-type electrode 480 and n-type electrode 470. In case of connecting the first pad 472 of the first type electrode (p-type electrode) 470 to the positive electrode of the power supply 492 and connecting the second pad 482 of the second electrode (n-type electrode) 480 to the negative electrode of the power supply 492, the light-emitting device 450 can be considered as the two light-emitting diodes 450A and 450B connecting to the power supply 492 in parallel. At least one end of the depression 464 is inside the interior of the stacked structure 492, and the depression 464 in the light-emitting device 450A and that in the light-emitting device 450B are arranged in a mirror-image manner.

The light-emitting device 450 is rectangular, the first pad 472 is positioned at a corner 466, and the second pad 482 is positioned around the middle of a side 468 opposite to the corner 466. In addition, the first electrode 470 and the second electrode 480 in the light-emitting device 450A and those in the light-emitting device 450B are arranged in a mirror-image manner. The first pad 472 and the second pad 482 are positioned in opposite corners in the light-emitting device 450A, and the first pad 472 and the second pad 482 are positioned in opposite corners in the light-emitting device 450B.

Figure 20:
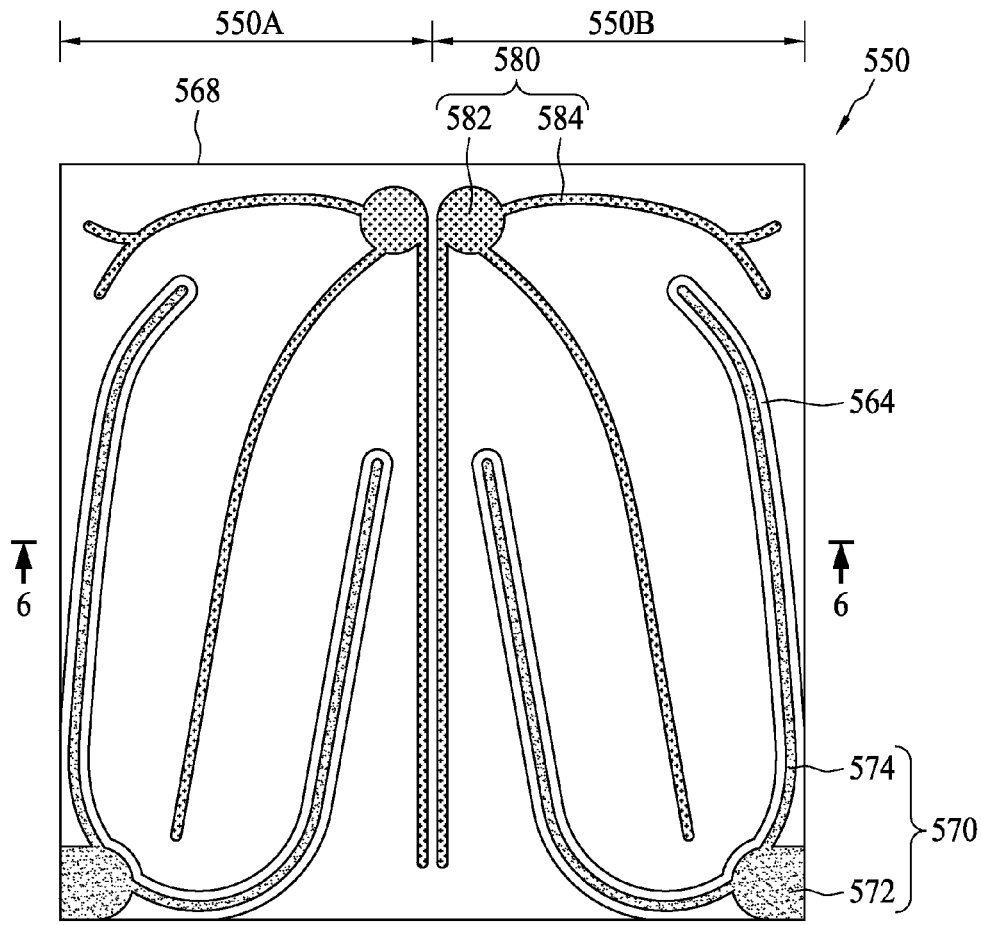
FIG. 20 is a top view of the light-emitting device according to one embodiment of the present disclosure.
Figure 21:
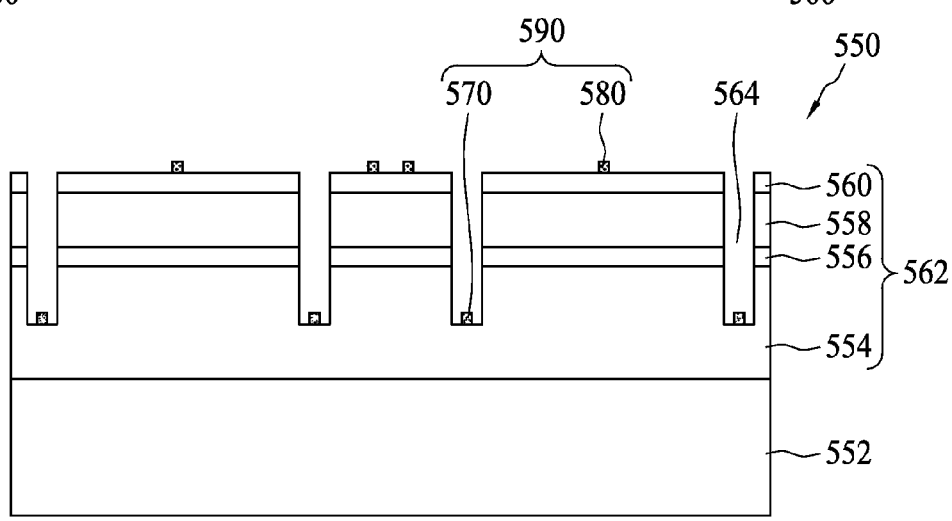
FIG. 21 is a cross-sectional view along the line 6-6 in FIG. 20.
Figure 22:
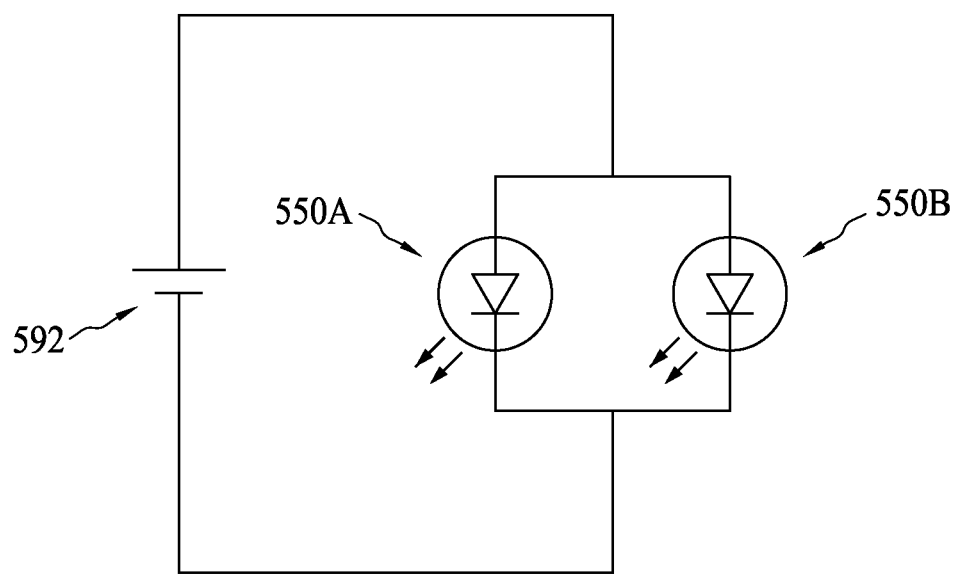
FIG. 22 is an equivalent circuit of the light-emitting device in FIG. 20 electrically connected to a power supply.

FIGS. 20 to 22 illustrate a light-emitting device 550 according to one embodiment of the present disclosure, wherein FIG. 20 is a top view of the light-emitting device 550, FIG. 21 is a cross-sectional view along the line 6-6 in FIG. 20, and FIG. 22 is an equivalent circuit of the light-emitting device 350 electrically connected to a power supply 592. Referring to FIG. 20 and FIG. 21, the light-emitting device 550 includes a substrate 552, a stacked structure 562 with a depression 564 therein, at least two first electrodes 570 positioned in the depression 564, and at least two second electrodes 580 positioned on the stacked structure 562. The stacked structure 562 includes a first type (n-type) semiconductor layer 554 positioned on the substrate 552, a light-emitting structure 556 positioned on the first type semiconductor layer 554, a second type (p-type) semiconductor layer 558 positioned on the light-emitting structure 556, and a contact layer 560 positioned on the second type semiconductor layer 558.

The at least two first electrodes 570 serve as the n-type electrode of the light-emitting device 550 and the at least two second electrodes 580 serve as the p-type electrode of the light-emitting device 550 to form an electrode structure 590. The depression 564 exposes the first type semiconductor layer 554, the at least two first electrodes 570 are positioned on the first type semiconductor layer 554 in the depression 564, and the at least two first electrodes 570 are spaced apart from each other. Each of the first electrodes 570 can be an interdigital electrode including at least one first pad 572 and at least one first extending wire 574 with one end connected to the first pad 572. For example, the first electrode 570 can be an interdigital electrode including two first extending wires 574. The first extending wire 574 is positioned in the interior of the light-emitting device 550, and does not surround the border of the light-emitting device 550.

The at least two second electrodes 580 are spaced apart from each other and positioned on the second type semiconductor layer 558 such as on the surface of the contact layer 560. Each of the second electrodes 580 includes at least one second pad 582 and at least one second extending wire 584 with one end connected to the second pad 582. For example, the second electrode 580 can be an interdigital electrode including three second extending wires 584. The first extending wire 574 is positioned in the interior of the light-emitting device 550, and does not surround the border of the light-emitting device 550. In one embodiment of the present disclosure, the distance between the second pad 582 and the border of the electrode structure 590 (or the border of the light-emitting device 550) is less than 200 microns.

Referring to FIG. 20 and FIG. 22, the light-emitting device 550 can be considered as two light-emitting diodes 550A and 550B that use the same stacked structure 562 but use the respective p-type electrode 580 and n-type electrode 570. In case of connecting the first pad 572 of the first type electrode (n-type electrode) 570 to the negative electrode of the power supply 592 and connecting the second pad 582 of the second electrode (p-type electrode) 580 to the positive electrode of the power supply 592, the light-emitting device 550 can be considered as the two light-emitting diodes 550A and 550B connecting to the power supply 592 in parallel. At least one end of the depression 564 is inside the interior of the stacked structure 592, and the depression 564 in the light-emitting device 550A and that in the light-emitting device 550B are arranged in a mirror-image manner.

The distance between the first pad 572 and the second pad 582 is greater than 70% of the width of the light-emitting device 550. Preferably, the distance between the first pad 572 and the second pad 582 is less than 120% of the width of the light-emitting device 550. The distance between the first extending wire 574 and the second extending wire 582 is between 5% and 15% of the width of the light-emitting device 550. The first electrode 572 and the second electrode 582 occupy an area between 5% and 10% of that of the light-emitting device 550. The first extending wire 572 is not parallel to the border of the light-emitting device 550, the second extending wire 582 is not parallel to the border of the light-emitting device 550, and the first extending wire 572 is not parallel to the second extending wire 582.

The light-emitting device 550 is rectangular, the first pad 572 is positioned at a corner 566, and the second pad 582 is positioned around the middle of a side 568 opposite to the corner 566. In addition, the first electrode 570 and the second electrode 580 in the light-emitting device 550A and those in the light-emitting device 550B are arranged in a mirror-image manner. The first pad 572 and the second pad 582 are positioned in opposite corners in the light-emitting device 550A, and the first pad 572 and the second pad 582 positioned in opposite corners in the light-emitting device 550B.

Figure 23:
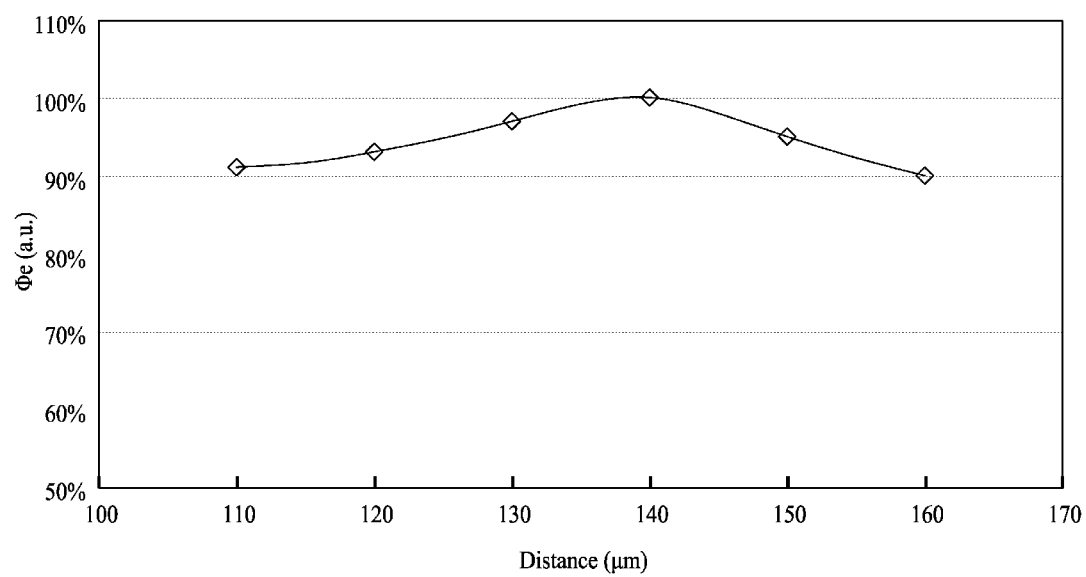
FIG. 23 illustrates the experimental relation between the brightness (Φe) and the distance between the first extending wires according to one embodiment of the present disclosure.

FIG. 23 illustrates the experimental relation between the brightness ($\Phi e$) and the distance between the first extending wire and the second extending wire, which applies to the embodiments shown in FIGS. 5 to 22. It can be seen in FIG. 23 that the maximum brightness is located at the distance about 140 microns, and the width of the light-emitting device is about 1150 micron, i.e., the distance between the first extending wire and the second extending wire is about 12% of the width of the light-emitting device. In one embodiment of the present disclosure, the distance between the first extending wire and the second extending wire is between 5% and 15% of the width of the light-emitting device, the distance between the first pad and the second pad is greater than 70% of the width of the light-emitting device. Preferably, the distance between the first pad and the second pad is less than 120% of the width of the light-emitting device. In one embodiment of the present disclosure, the first electrode and the second electrode occupy an area between 5% and 10% of that of the light-emitting device. In one embodiment of the present disclosure, the first extending wire is not parallel to the border of the light-emitting device, the second extending wire is not parallel to the border of the light-emitting device, and the first extending wire is not parallel to the second extending wire.

Although the present invention and its advantages have been described in detail, it should be understood that various changes, substitutions and alterations can be made thereto without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrode structure, comprising:
   first electrodes physically separated from each other, each of the first electrodes comprising a first pad and a first extending wire connected to the first pad, wherein the first pads of the first electrodes are separated from each other having a first distance therebetween; and
   second electrodes substantially surrounded by the first electrodes, each of the second electrodes comprising a second pad and a second extending wire connected to the second pad, the second electrodes being physically separated from one another, the second pads of the second electrodes are separated from each other having a second distance therebetween, wherein the second distance is shorter than the first distance, wherein the second electrode comprises a plurality of second branches connected to the second extending wire.

2. The electrode structure of claim 1, wherein the first electrodes and the second electrodes are electrically connected in parallel.

3. The electrode structure of claim 1, wherein the electrode structure has a border which is away from the second pad by a distance less than 200 microns.

4. The electrode structure of claim 1, wherein the first extending wire, the second extending wire, or both are cured or straight.

5. The electrode structure of claim 1, wherein the first pad is positioned at a corner of the electrode structure.

6. The electrode structure of claim 1, wherein the first extending wire has a portion not parallel to the second extending wire.

7. The electrode structure of claim 1, wherein the first extending wire is parallel to the second extending wire.

* * * * *